United States Patent
Langner et al.

(10) Patent No.: US 9,634,800 B1
(45) Date of Patent: Apr. 25, 2017

(54) SUB-RATE CODES WITHIN THE 10GBASE-T FRAME STRUCTURE

(71) Applicant: Aquantia Corporation, Milpitas, CA (US)

(72) Inventors: Paul Langner, Fremont, CA (US); Hossein Sedarat, San Jose, CA (US)

(73) Assignee: Aquantia Corp., Milpitas, CA (US)

( * ) Notice: Subject to any disclaimer, the term of this patent is extended or adjusted under 35 U.S.C. 154(b) by 71 days.

(21) Appl. No.: 14/730,083

(22) Filed: Jun. 3, 2015

Related U.S. Application Data

(63) Continuation-in-part of application No. 13/966,208, filed on Aug. 13, 2013.

(60) Provisional application No. 61/682,694, filed on Aug. 13, 2012.

(51) Int. Cl.
| | |
|---|---|
| *H03M 13/00* | (2006.01) |
| *H04L 1/00* | (2006.01) |
| *H03M 13/15* | (2006.01) |
| *H03M 13/11* | (2006.01) |
| *H04L 27/02* | (2006.01) |

(52) U.S. Cl.
CPC ....... *H04L 1/0057* (2013.01); *H03M 13/1102* (2013.01); *H03M 13/1515* (2013.01); *H04L 27/02* (2013.01)

(58) Field of Classification Search
CPC ... G06F 11/10; H03M 13/1102; H03M 13/11; H03M 13/1108; H03M 13/3707; H03M 13/3738; H04B 10/27; H04B 10/40; H04L 1/004; H04L 12/413; H04L 1/002; H04L 1/0057
See application file for complete search history.

(56) References Cited

U.S. PATENT DOCUMENTS

| | | |
|---|---|---|
| 5,680,400 A | 10/1997 | York |
| 6,052,385 A | 4/2000 | Kanerva |
| 6,081,523 A | 6/2000 | Merchant et al. |
| 6,111,890 A | 8/2000 | Rao |

(Continued)

OTHER PUBLICATIONS

Ken Christense et al., IEEE 802.3az The Road to Energy Efficient Ethernet, IEEE Communications Magazine, Nov. 2010, 7 Pages.

(Continued)

*Primary Examiner* — David Ton
(74) *Attorney, Agent, or Firm* — Lance Kreisman; Peninsula Patent Group

(57) ABSTRACT

A BASE-T Ethernet transceiver is disclosed. The transceiver includes a BASE-T Ethernet data framing module having an input interface to receive Ethernet block data bits at a first data rate, logic to associate the Ethernet block data bits with an auxiliary bit and a number of Reed-Solomon check bytes, and a forward error correction encoder. The encoder is coupled to the logic to encode all of the data bits, auxiliary bit and the Reed-Solomon check bytes into a first error encoded transport frame having plural error check bits. A symbol mapper receives the first error encoded transport frame and modulates the first error encoded transport frame into symbols, each of the symbols having uncoded bits. A BASE-T transmitter is coupled to the symbol mapper to transmit the first group of symbols over an Ethernet link at one of a selection of symbol rates. Errors in the uncoded bits are correctable via the Reed-Solomon check bytes.

19 Claims, 18 Drawing Sheets

(56) References Cited

U.S. PATENT DOCUMENTS

| | | |
|---|---|---|
| 6,195,360 B1 | 2/2001 | Raza et al. |
| 7,027,407 B2 | 4/2006 | Diepstraten et al. |
| 7,324,511 B2 | 1/2008 | Nishihara |
| 7,525,992 B1 | 4/2009 | Shachal |
| 7,567,620 B2 | 7/2009 | Rozental |
| 7,593,431 B1 | 9/2009 | Lo et al. |
| 7,693,240 B2 | 4/2010 | Mezer |
| 7,720,075 B2 | 5/2010 | Costo |
| 7,782,852 B2 | 8/2010 | Tellado et al. |
| 8,112,646 B2 | 2/2012 | Tsai |
| 8,201,005 B2 | 6/2012 | Wertheimer et al. |
| 8,218,612 B2 | 7/2012 | Chien |
| 8,243,752 B2 | 8/2012 | Barkan |
| 8,276,013 B2 | 9/2012 | Diab et al. |
| 8,320,411 B1 | 11/2012 | Sedarat et al. |
| 9,143,142 B2 * | 9/2015 | Meagher ............... H04J 3/0638 |
| 2002/0006167 A1 | 1/2002 | McFarland |
| 2002/0119783 A1 | 8/2002 | Bourlas et al. |
| 2003/0016797 A1 | 1/2003 | Zakrzewski |
| 2003/0040298 A1 | 2/2003 | Heatley |
| 2004/0184810 A1 | 9/2004 | Spilman et al. |
| 2005/0018784 A1 | 1/2005 | Kurobe |
| 2005/0030808 A1 | 2/2005 | Brown et al. |
| 2005/0055467 A1 | 3/2005 | Campana et al. |
| 2005/0058152 A1 | 3/2005 | Oksanen et al. |
| 2005/0105545 A1 | 5/2005 | Thousand et al. |
| 2005/0152466 A1 | 7/2005 | Maltsev et al. |
| 2005/0259685 A1 | 11/2005 | Chang et al. |
| 2005/0286521 A1 * | 12/2005 | Chiang ................. H04J 3/1652 |
| | | 370/389 |
| 2006/0109784 A1 | 5/2006 | Weller et al. |
| 2006/0153307 A1 | 7/2006 | Brown et al. |
| 2006/0215561 A1 | 9/2006 | Wang et al. |
| 2007/0192505 A1 | 8/2007 | Dalmia |
| 2007/0248024 A1 | 10/2007 | Conway et al. |
| 2008/0095188 A1 | 4/2008 | Remy |
| 2008/0151792 A1 | 6/2008 | Taich |
| 2008/0187028 A1 | 8/2008 | Lida |
| 2008/0294919 A1 | 11/2008 | Lida et al. |
| 2009/0080459 A1 * | 3/2009 | Barkan ................. H04L 1/0002 |
| | | 370/463 |
| 2009/0150745 A1 | 6/2009 | Langner et al. |
| 2009/0282277 A1 | 11/2009 | Sedarat |
| 2010/0075704 A1 | 3/2010 | McHenry et al. |
| 2010/0115295 A1 | 5/2010 | Diab |
| 2010/0188980 A1 | 7/2010 | Desai et al. |
| 2010/0241923 A1 | 9/2010 | Wang et al. |
| 2011/0249687 A1 | 10/2011 | Diab et al. |
| 2012/0026922 A1 | 2/2012 | Diab |
| 2012/0063295 A1 | 3/2012 | Bliss |
| 2012/0106345 A1 | 5/2012 | Diab |
| 2012/0170591 A1 | 7/2012 | Diab et al. |
| 2012/0188894 A1 | 7/2012 | Huschke et al. |
| 2013/0070823 A1 | 3/2013 | Malkin et al. |
| 2014/0040704 A1 | 2/2014 | Wu et al. |
| 2015/0030337 A1 * | 1/2015 | Mateosky ........... H04L 27/2096 |
| | | 398/135 |
| 2015/0067380 A1 | 3/2015 | Zhan et al. |

OTHER PUBLICATIONS

Hugh Barrass, EEE Exchange of Management Information, IEEE 802.3az EEE Task Force, Mar. 2009, Vancouver, British Columbia, 11 Pages.

Nariman Yousefi, Multi Rate PHY, IEEE Meeting Slides, Jul. 2003, 14 pages.

Zhang et al; IEEE Apr. 2010; pp. 843-855; "An Efficient 10GBASE-T Ethernet LDPC Decoder Design with Low Error Floors".

Mankar et al.; ACEEE, Proc of Intl. Conf. on Recent Trends in Information, Telecommunication and Computing, ITC; 5 pages; "Algorithms and Architectures for Reduced Complexity LDPC Decoding", 2014.

\* cited by examiner

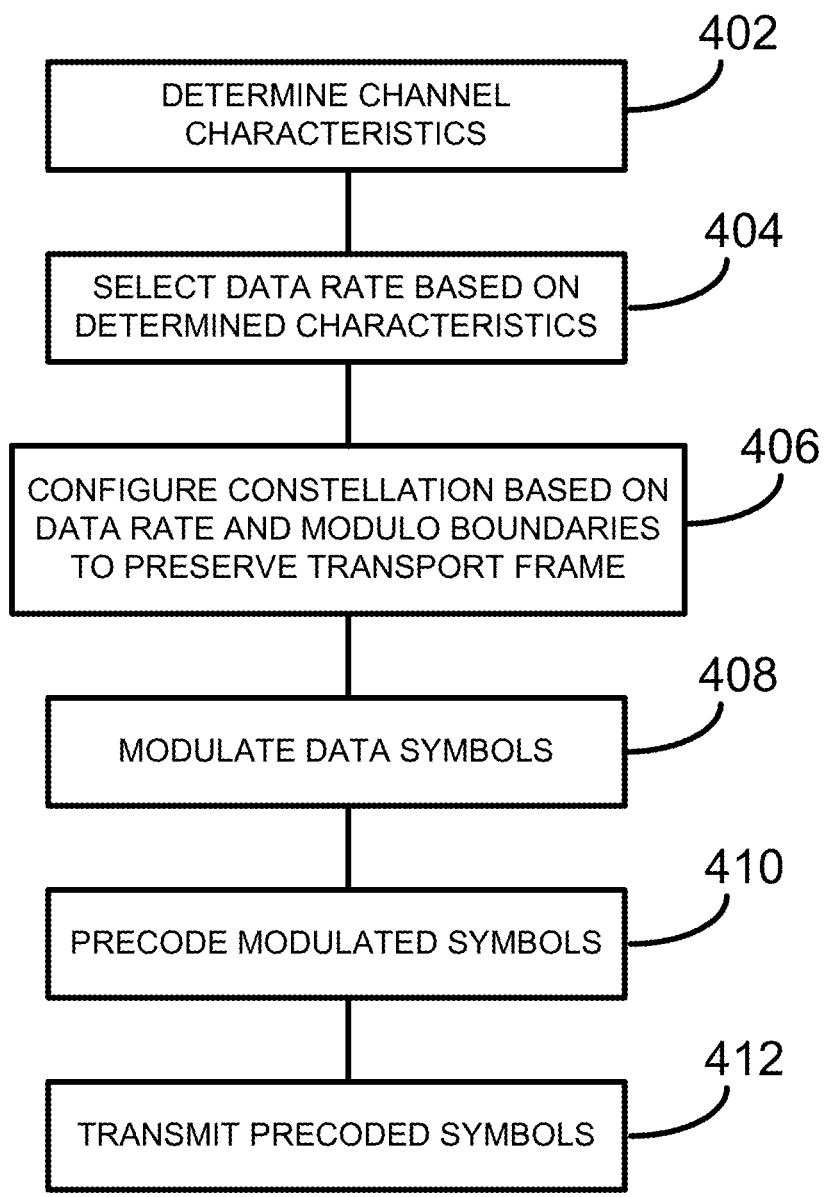

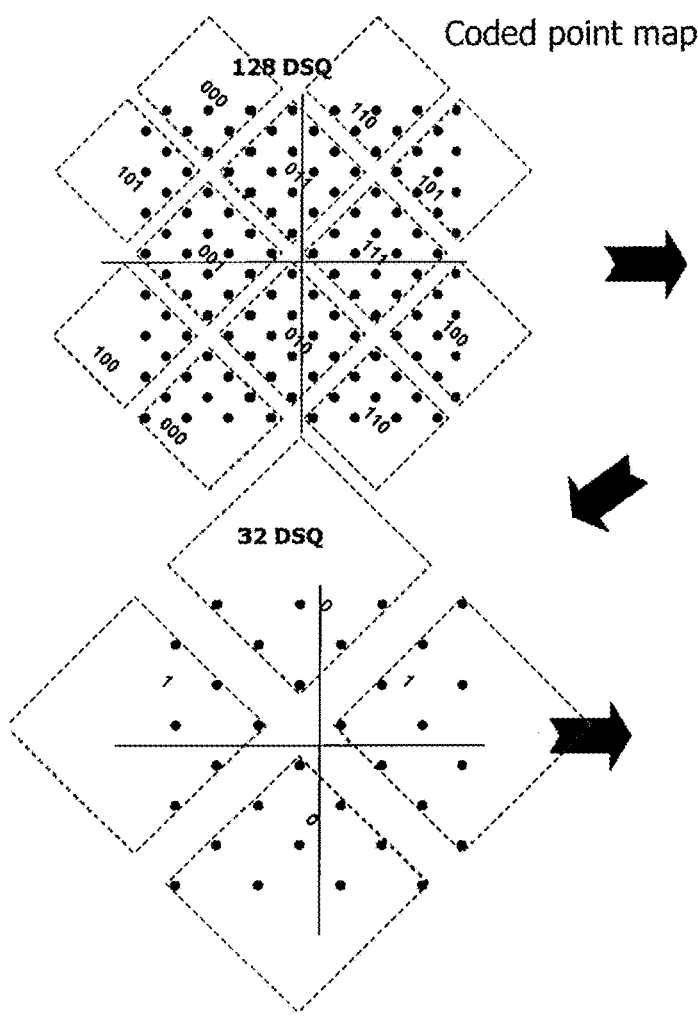
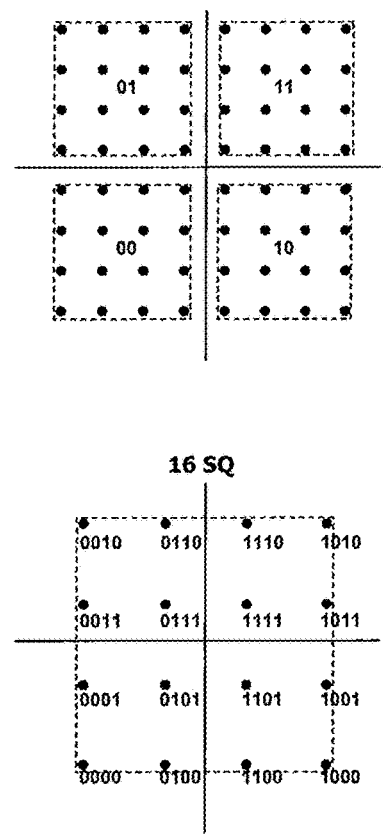
FIG. 6a
FIG. 6b
FIG. 6c
FIG. 6d

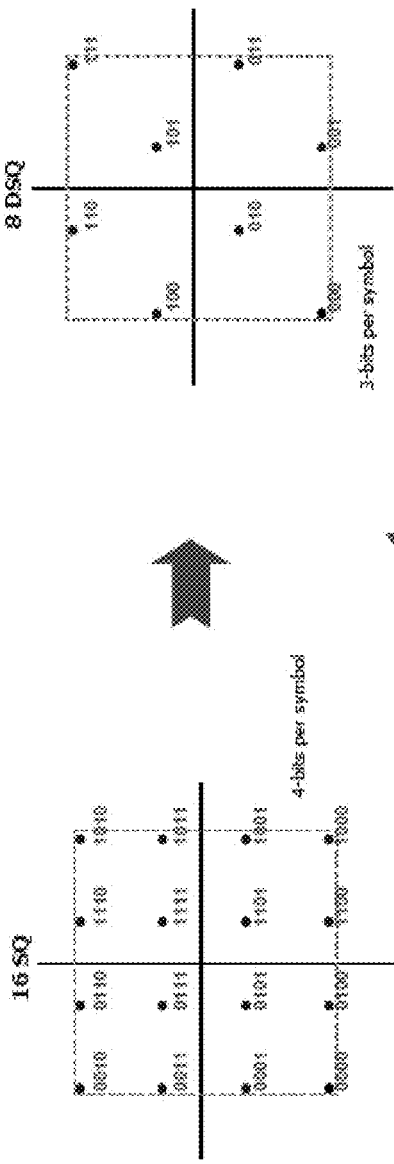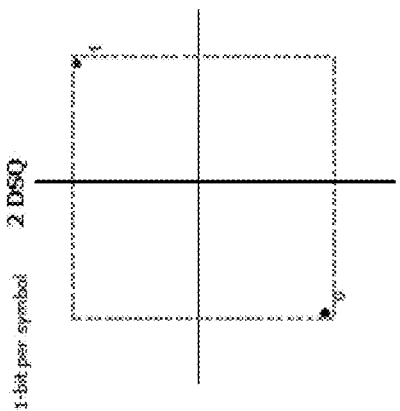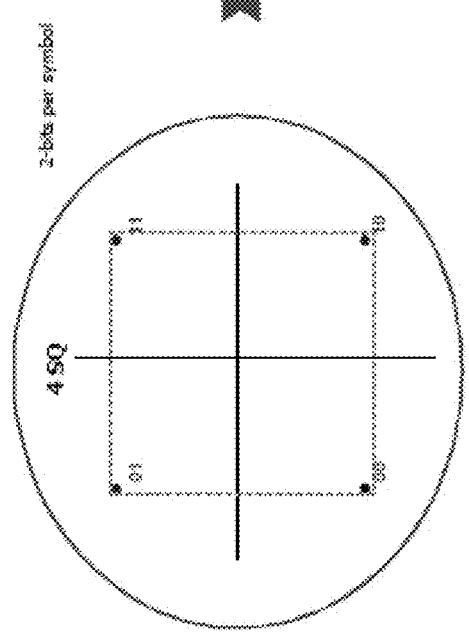

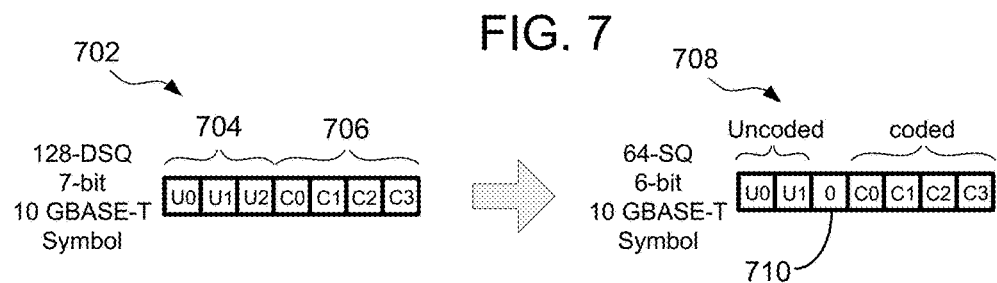
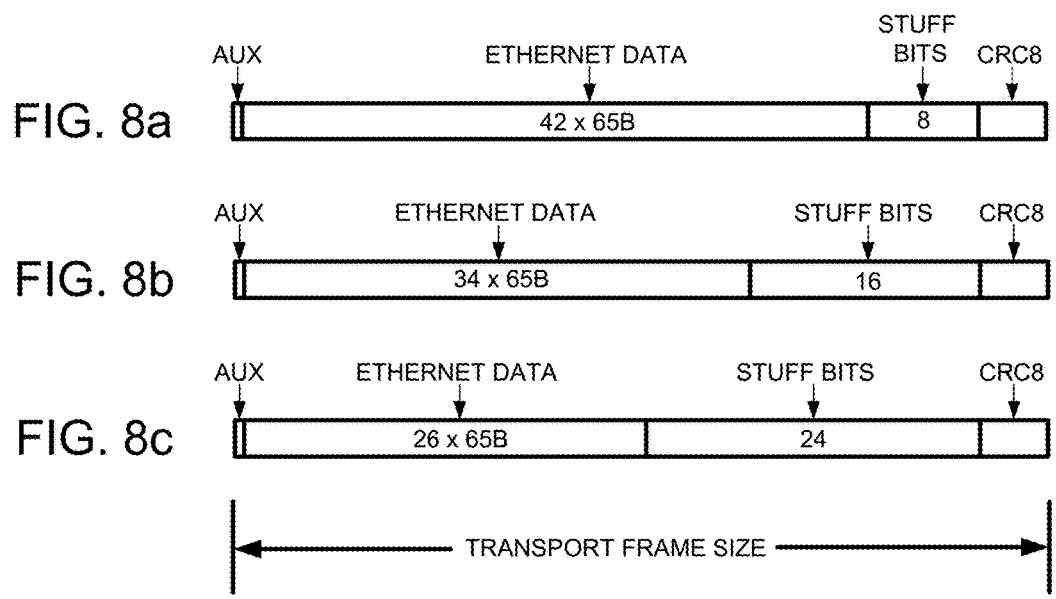

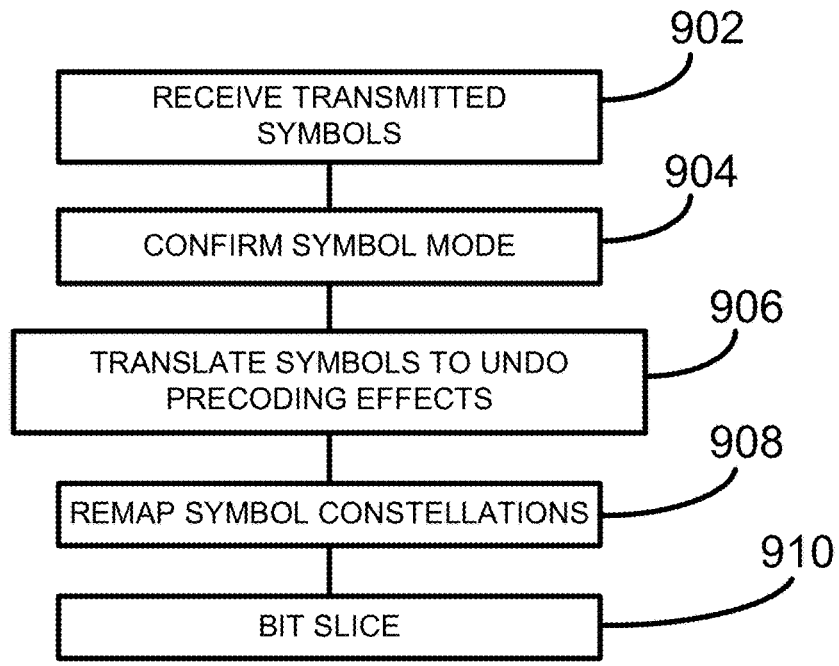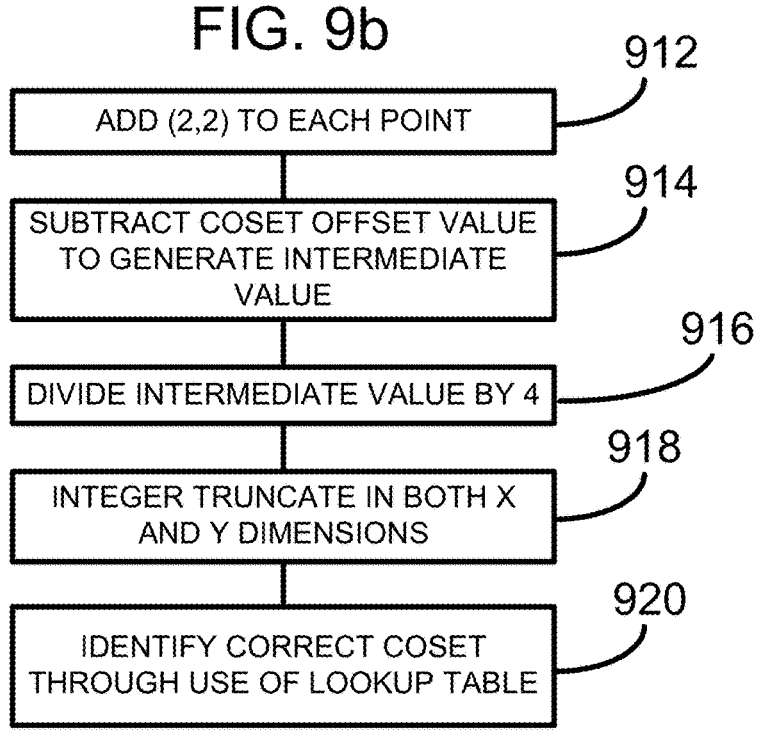

Increment = 16

Per Axis $P_{NORM}$ = 64.00

FIG. 16

```
int lookup[6][6] =
{0, 1, 0, 1, 0, 1,
 2, 3, 2, 3, 2, 3,
 0, 1, 0, 1, 0, 1,
 2, 3, 2, 3, 2, 3,
 0, 1, 0, 1, 0, 1,
 2, 3, 2, 3, 2, 3};
```

FIG. 17

```
int lookup[6][6] =
{1, 0, 1, 0, 1, 0,
 0, 1, 0, 1, 0, 1,
 1, 0, 1, 0, 1, 0,
 0, 1, 0, 1, 0, 1,
 1, 0, 1, 0, 1, 0,
 0, 1, 0, 1, 0, 1};
```

|   | 0 | 1 | 2 | 3 | 4 | 5 |
|---|---|---|---|---|---|---|
| 5 | 1 | 0 | 1 | 0 | 1 | 0 |
| 4 | 0 | 1 | 0 | 1 | 0 | 1 |
| 3 | 1 | 0 | 1 | 0 | 1 | 0 |
| 2 | 0 | 1 | 0 | 1 | 0 | 1 |
| 1 | 1 | 0 | 1 | 0 | 1 | 0 |
| 0 | 0 | 1 | 0 | 1 | 0 | 1 |

SUB-RATE CODES WITHIN THE 10GBASE-T FRAME STRUCTURE

RELATED APPLICATIONS

This application claims the benefit of priority under 35 U.S.C. 119(e) to Regular application Ser. No. 13/966,208, filed Aug. 13, 2013, now U.S. Pat. No. 9,485,335, issued Nov. 1, 2016, entitled SUB-RATE CODES WITHIN THE 10GBASE-T FRAME STRUCTURE, which claims priority to Provisional Application No. 61/682,694, filed Aug. 13, 2012, entitled SUB-RATE CODES WITHIN THE 10GBASE-T FRAME STRUCTURE.

TECHNICAL FIELD

The disclosure herein relates generally to electronic communications, and more particularly to coding and decoding received data in electronic communications.

BACKGROUND

Transferring information between computers and other electronic devices can be implemented using any of a variety of different standards and technologies. Channel coding and error correction techniques can be used to reduce errors in received signals introduced from distortion and other disturbances. Such coding and error correction can be implemented using an encoder and a decoder at the ends of the transmission channel.

One increasingly popular communication standard is 10 Gigabit Ethernet, with a nominal data rate of 10 Gbit/s. 10GBASE-T is one such standard used to provide 10 gigabit per second connections over unshielded or shielded twisted pair cables. FIG. 1 illustrates a standard 10GBASE-T architecture, with respective first and second network devices 110a and 110b communicating via transceiver circuits 112a and 112b over a link 106. The wire-level modulation for 10GBASE-T is a Tomlinson-Harashima Precoded (THP) version of pulse-amplitude modulation with 16 discrete levels (PAM-16), encoded in a two-dimensional constellation pattern known as 128-DSQ (Double Square QAM).

As shown in FIG. 2, the 10GBASE-T transport frame is based on a (2048, 1723) Low Density Parity Check (LDPC) code, i.e. 2048 total bits with 1723 data bits and 325 check bits per frame, where the check bits are used to fix or detect errors in the frame. This is used in combination with the 128-DSQ synthetic constellation that uses a combination of coded and uncoded bits to transmit information. As shown, Ethernet data is retrieved in fifty 65-bit blocks and is scrambled, e.g. provided to a self-synchronizing scrambler to scramble the bits, and a CRC-8 generation of 8 check bits is provided on one end of the frame and an auxiliary channel bit on the other end, creating 3259 bits in the frame payload. The payload is then divided up into 1723 bits for the LDPC coder, and 1536 uncoded bits (3×512) that are not coded by the LDPC coder. The coded LDPC check bits (325 bits) are added to the end of the payload. The LDPC block size after coding is 2048 total bits (4×512).

The resulting frame is mapped to 128-DSQ symbols, and the resulting DSQ symbols are then precoded using THP. Each of these 512 128-DSQ symbols are then transmitted as a pair of PAM-16 symbols (x-axis and y-axis), to create 1024 symbols (3584 bits). The constellation for 128-DSQ symbols is shown in FIG. 3, and consists of 8 cosets (regions), each coset containing 16 points. The coset label contains the 3 uncoded bits as shown in FIG. 3, and the points within the coset contain the 4 coded bits protected using the LDPC block code. The labeling of the points in the coset (the coset elements) conveying the 4 coded bits is also shown in FIG. 3.

The receiver unscrambles a received frame and decodes the coded bits. Any of several decoding algorithms for LDPC codes can be used in the receiver to decode the received coded bits. For example, iterative decoders are often used to converge on a correct decoded value. In one implementation, LDPC decoding is performed in the receiver using a soft-decision, message-passing algorithm. The bits are treated as continuous variables which represent the probability of the value being a 0 or a 1, and the continuous variables are represented in the decoding algorithm as Log Likelihood Ratios (LLRs). The message passing algorithm sets the variable nodes to the soft receive LLRs, calculates the syndrome LLRs given the variable LLRs, updates the variable LLRs with the new syndrome information, and iterates in this same way until a convergence is reached (e.g., check bits are zero). Using the 10GBASE-T transmission scheme, it is possible to have very low bit error rates that come very close to the Shannon limit of the communication channel.

While the transmission scheme described above works well for its intended applications, in some circumstances the link may be of a lower quality than anticipated, preventing the transceiver from communicating successfully at 10 Gb/s. The IEEE standard addresses the problem by requiring backwards compatibility to older Ethernet standards that communicate at rates of 1 Gb/s and/or 100 Mb/s. Thus, if the link is incapable of supporting 10 Gb/s, the transmission rate is scaled back to either 1 Gb/s or 100 Mb/s, or lower.

Scaling back the transmission rate in the conventional manner described above may unnecessarily limit the transmission rate far below what the link may be capable of supporting. For example, many industrial buildings and homes are wired with conventional CAT-5 cabling, which incorporates unshielded twisted-pair wires for older phone lines. CAT-5 cabling may in many cases support data rates between 5-10 Gb/s. Even if the cable is able to support 8 Gb/s, however, scaling back the data rate conventionally would dial down the transmission rate to 1 Gb/s, far below what could be supported.

Accordingly, what is needed is a system and method that provides more flexibility in scaling the data rates of 10GBASE-T Ethernet channels.

BRIEF DESCRIPTION OF THE DRAWINGS

FIG. 4 illustrates a flowchart for a method of transmitting 10GBASE-T symbols;

FIG. 5b illustrates a flowchart with further detailed steps for one embodiment of the method of FIG. 5a;

FIGS. 6a-6d illustrate respective 128 DSQ, 64 SQ, 32 DSQ and 16 SQ constellations corresponding to respective 3, 2, 1, and 0 uncoded bit modulations;

FIGS. 6e-6h illustrate respective 16 SQ, 8 DSQ, 4 SQ and 2 DSQ constellations;

FIG. 7 illustrates a 10GBASE-T symbol data structure for use with the constellations of FIGS. 6a-6h;

FIGS. 8a-8c illustrate the transport frames corresponding to the 64 SQ, 32 DSQ and 16 SQ constellations of FIGS. 6b-d;

FIG. 9a illustrates a flowchart for a method of receiving 10GBASE-T symbols;

FIG. 9b illustrates a flowchart showing further detailed steps of the bit slicing of FIG. 9a;

FIG. 16 illustrates an example of a further remapping of a 64 SQ constellation for the uncoded bit slicing of FIG. 9b;

FIG. 17 illustrates an example of a further remapping of a 32 DSQ constellation for the uncoded bit slicing of FIG. 9b.

DETAILED DESCRIPTION

Figure 1:
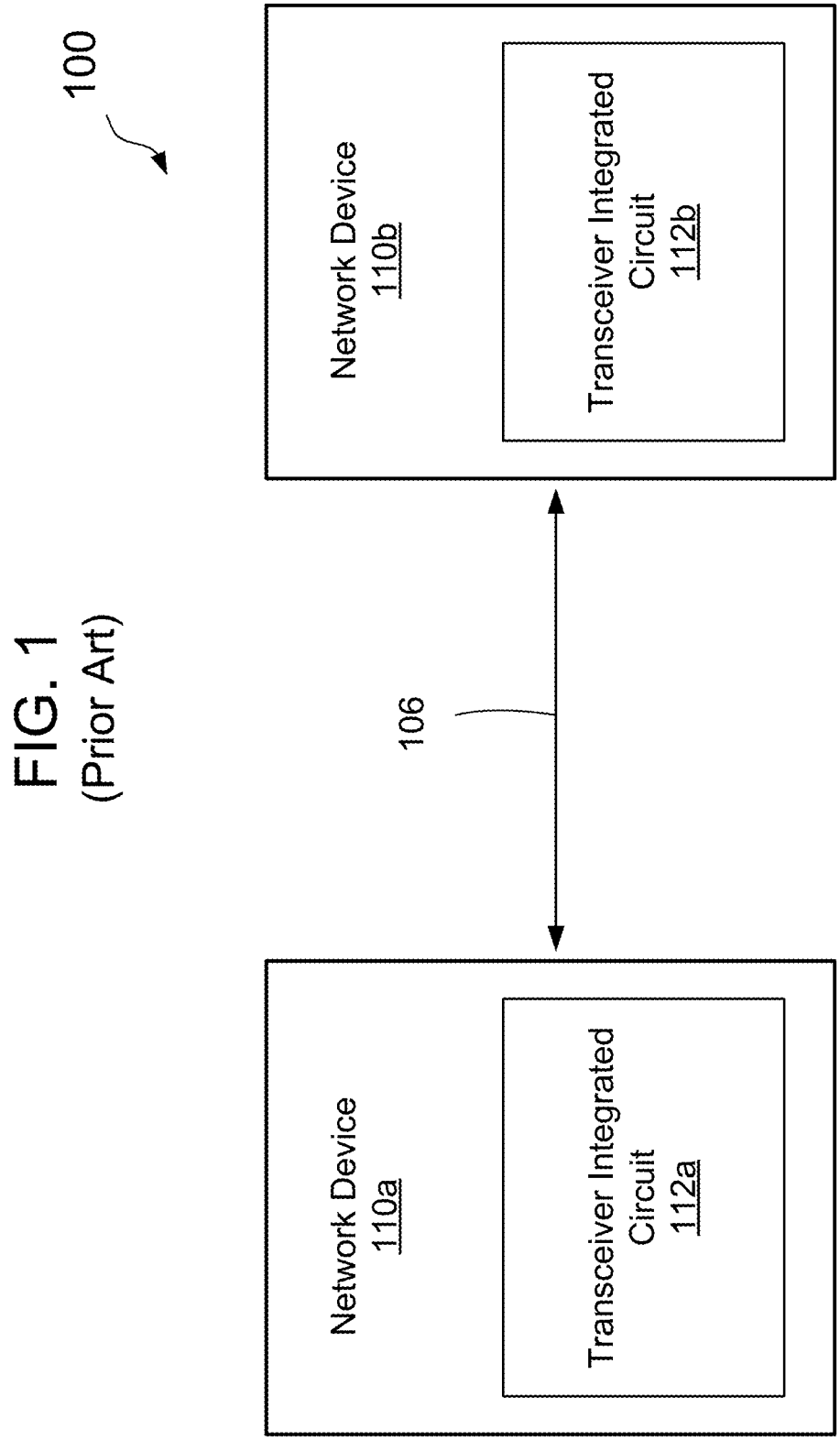
FIG. 1 illustrates a 10GBASE-T signaling link bounded by respective transceivers.
Figure 2:
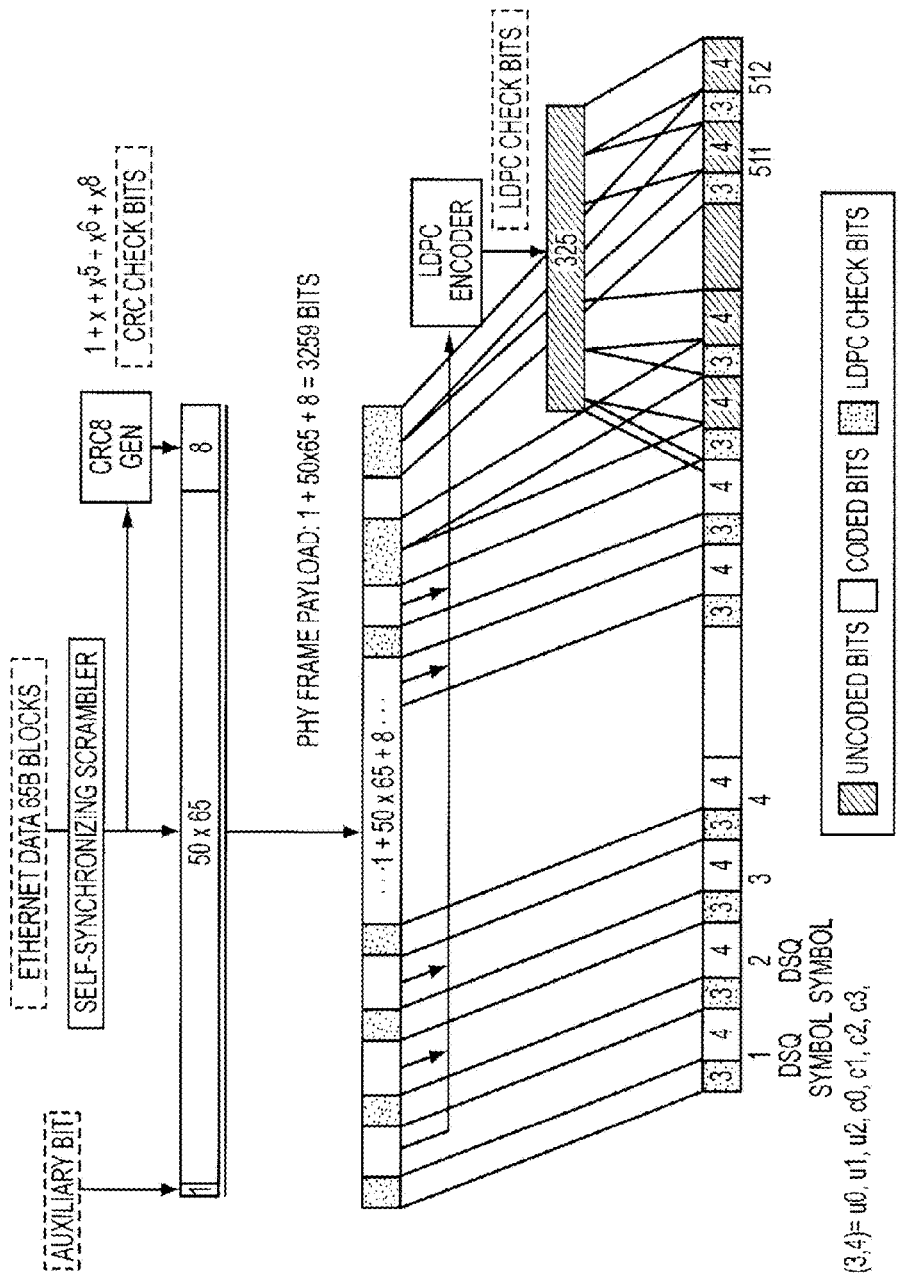
FIG. 2 illustrates a transmission frame for the 10GBASE-T communication standard.

Embodiments of methods of signaling along a high-speed Ethernet link are disclosed. In one embodiment, a method of operation in a high-speed Ethernet transceiver is disclosed. The transceiver is rated to communicate data at a maximum data rate and for coupling to a link. The method includes engaging in an autonegotiation process with a link partner transceiver to indicate whether one or more sub-rate modes of operation are supported. Each sub-rate mode of operation corresponds to a sub-data rate that is less than the maximum data rate. The autonegotiation process is terminated. The transceiver then participates in a training process. The training process includes receiving a first training sequence corresponding to a first sub-data rate that is less than the maximum data rate. A signal quality parameter for the received first training sequence is measured. The training sequence is terminated based on the measured signal quality parameter failing a predetermined criteria. A second training sequence is then initiated that corresponds to a second sub-data rate that is less than the first sub-data rate without starting a second autonegotiation process.

Transmitter Processing

FIG. 4 illustrates a generalized method of 10GBASE-T symbol transmission that provides flexibility in reducing transmission data rates to account for impaired channels and/or reduced-power modes of operation. The method begins by determining one or more channel characteristics for the 10GBASE-T lanes, at step 402, in order to assess what data rates can be supported. This may involve carrying out a training sequence, such as that described below, and determining the highest rate of signal transmission at an acceptable bit-error-rate, or identifying the transmission medium, such as the cable type, and predicting the noise based on typical cable characteristics. A data rate is then selected from several possible data rates, including a default 10GBASE-T data rate of 10 Gb/s and other sub-rates that are less than 10 Gb/s, but not necessarily rates set at legacy Ethernet data rates, at step 404. One embodiment of a training sequence to identify a suitable data rate for transferring data between link partners is shown in the flow chart of FIG. 5a, and described in further detail below.

Further referring to FIG. 4, once the data rate is determined, a suitable mode of signal transmission is selected for the system, at step 406. The selected mode may be one from a group that includes symbol types based on the number of uncoded bits provided in each symbol frame, more fully described below. The symbol types, or constellations, correspond to a default mode corresponding to the conventional 10GBASE-T 128-DSQ symbol, and other modes corresponding to a 64-SQ symbol, a 32-DSQ symbol, a 16-SQ symbol, an 8DSQ symbol, a 4SQ symbol, or a 2DSQ symbol. The modes generally correspond to per-bit reductions in the number of information-carrying bits from the available 7 bits in each symbol frame. Nevertheless, each of the constellations are based upon a modulo operation in a constellation space bounded by +/−16, and where the constellation points are equidistant across the modulo boundary, as more fully discussed below.

Following the constellation configuration step, the data symbols are then modulated, at step 408, and precoded by a THP precoder, at step 410. The precoded symbols may then be transmitted by the 10GBASE-T transceiver, at step 412. One specific example of a 10GBASE-T transceiver architecture capable of carrying out the coding and decoding functionality described herein is disclosed in U.S. patent application Ser. No. 12/563,938, titled "Cancellation of Alien Interference in Communication Systems", assigned to the Assignee of the present disclosure, and expressly incorporated by reference herein in its entirety.

Figure 5A:
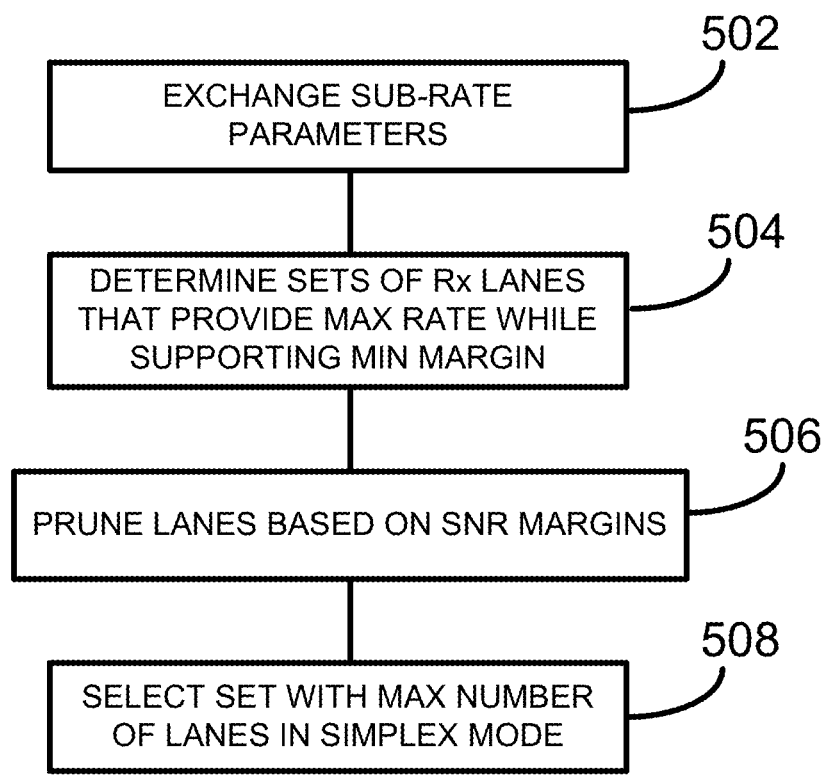
FIG. 5a illustrates a flowchart with further detailed steps for the data rate selection step of FIG. 4.

FIG. 5a illustrates a flowchart of steps that provide further detail relating to determining the channel characteristics and selecting the data rate from the method illustrated in FIG. 4. In one embodiment, the number of lanes for data transmission may be varied depending on the aggregate desired data rate and power considerations of the system. Reducing the number of lanes from four (the default number of lanes for a full 10 Gb/s data rate) to two generally halves the aggregate data rate, while further reducing to one lane reduces the rate to a quarter of the maximum. Additionally, selecting between simplex operation and duplex operation may be made. Simplex operation involves employing transmit and receive paths as separate pairs, reducing the amount of required equalization, and thus correspondingly reducing power dissipation.

Further referring to FIG. 5a, during an initialization routine, and more specifically an autonegotiation process, the ability to operate in one or more sub-rate modes is communicated between link partners. Once the link partners know that sub-rate modes are supported, an exchange of sub-rate parameters is carried out, at step 502. Generally, the parameters include the types of constellations that are supported, whether fewer lanes can be used for transmit and receive operations, and how to configure the link as simplex or duplex. During a training sequence following autonegotiation, the link partners communicate through, for example, an info-field exchange protocol, to measure and determine signal-to-noise ratios (SNR) corresponding to different sub-rate training sequences. For each given training sequence, if a corresponding measured SNR is below a minimal threshold, then the training sequence for that sub-rate is terminated, and a new training sequence started, without the need to initiate a new autonegotiation process. The sub-rate training sequences continue until a maximum sub-rate is identified that enables the link partners to communicate. The training process further determines and communicates maximum and minimum transmit and receive rates along with minimum and maximum SNR margins between the link partners. From this information, in some embodiments, a determination may be made of the sets of receiver lanes that provide maximum data rate while supporting a minimal SNR margin, at step 504. Note that the info-field exchange protocol enables the links to start training at a first given rate, then terminate (in response to determining an unacceptable SNR) and re-train at another sub-rate without having to restart the autonegotiation procedure. This significantly improves switching and response times in setting sub-rates at data rates less than 10 Gbps, and greater than 1 Gbps.

In one embodiment, a set of lanes is determined that support a high link performance, with a minimum number of lanes, and with as many of them operating in a simplex mode as possible. This generally involves pruning lanes based on SNR margins, at step 506, and selecting a set with a maximum number of lanes operating in simplex mode, at step 508.

Figure 5B:
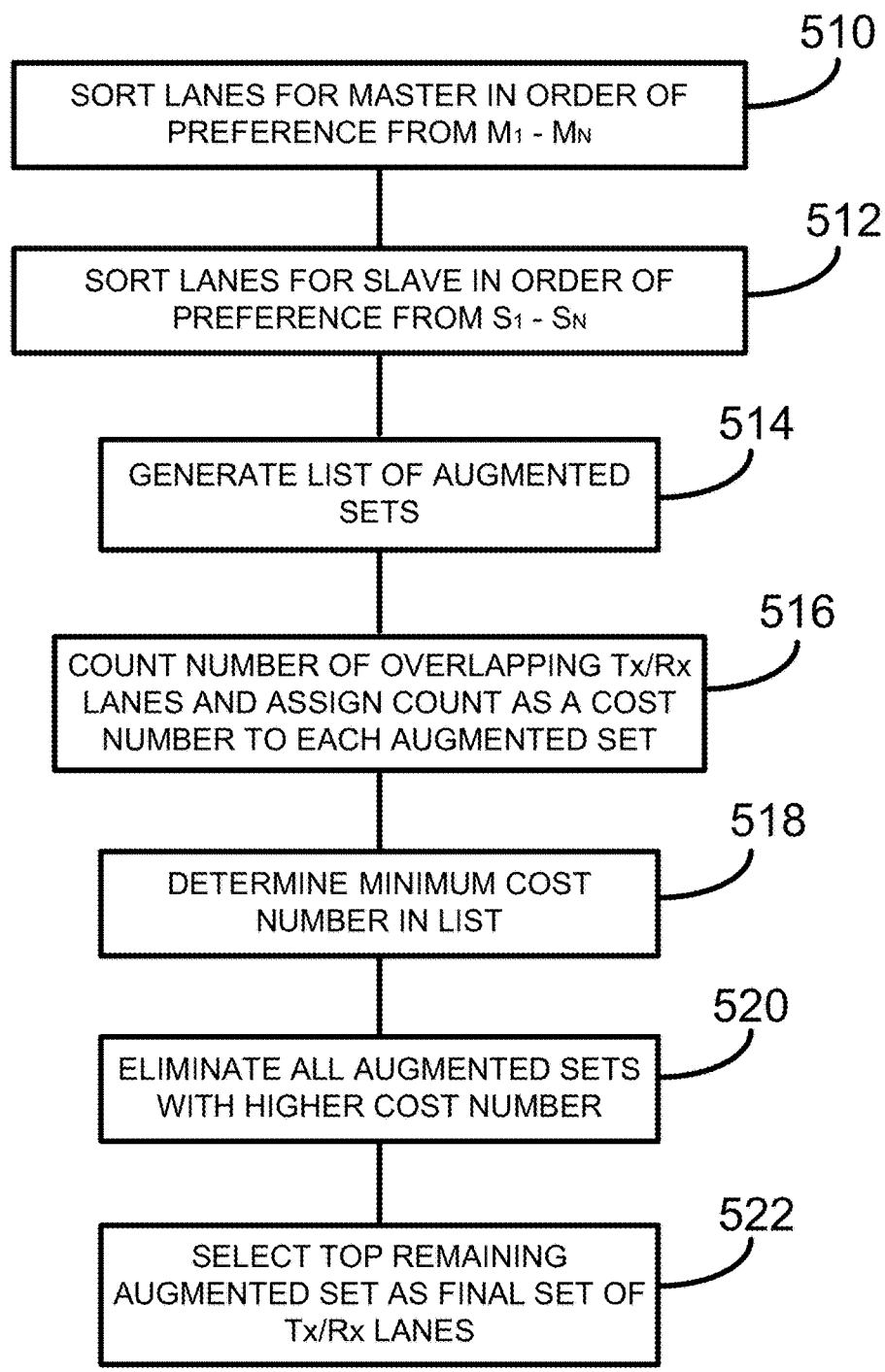

FIG. 5*b* illustrates further detailed steps that correspond to the lane pruning operations noted in FIG. 5*a*. Based on the margin information, the lanes are sorted in order of a Master's preference, from $M_1$-$M_N$, at step 510. A similar operation takes place from a Slave point of view, at step 512. A list of augmented sets is generated, at step 514, which matches up the various potential combinations of lanes and preferences. The number of overlapping transmit and receive lanes are counted, and the count is assigned as a cost number to each augmented set, at step 516. The minimum cost number is then determined from the list, at step 518. Augmented sets that have a higher cost number are eliminated, at step 520. The top remaining augmented step is then set as the final set of transmit and receive lanes, at step 522.

FIGS. 6*a*-6*d* illustrate various transmit constellations corresponding to several of the different transmission modes noted above. FIG. 6*a* illustrates a 128-DSQ constellation corresponding to a default 10GBASE-T data symbol as set forth in the 10GBASE-T IEEE standard. As explained above, each 10GBASE-T symbol has a 7-bit grouping that in a default mode includes 4 coded bits and 3 uncoded bits. The uncoded bits define "cosets", with each coset including an array of possible bit values corresponding to the coded bits. Under typical operating conditions, the 10GBASE-T symbols may be transmitted at a data rate of 10 Gb/s. For non-optimum conditions, the IEEE standard dictates that the 10GBASE-T transceiver logic reduce the data rate to prior generation Ethernet transmission standards, notably 1 Gb/s or lower.

In an effort to flexibly reduce the 10GBASE-T data rate for impaired and/or low-power applications, and without the necessity of dropping the data rate by 90%, FIGS. 6*b*-6*d* illustrate bit constellations where the number of uncoded bits, and thus resulting cosets, are reduced to two to define a 64 SQ constellation (FIG. 6*b*), reduced to one to define a 32 DSQ constellation (FIG. 6*c*) and reduced to zero to define a 16 5Q constellation (FIG. 6*d*). Reducing the number of uncoded bits in the 10GBASE-T symbol provides a way to reduce the transmission data rate below 10 Gb/s, yet well above the prior Ethernet generation level of 1 Gb/s as specified by the IEEE standard. Each reduced uncoded bit correspondingly reduces the number of constellation points by half, and spreads the points farther out from each other, increasing the effective SNR by 3 dB. Moreover, as more fully described below, the uncoded bits may be reduced without altering the frame structure of the 10GBASE-T transmission frame, thereby preserving a majority of the transceiver circuitry and simplifying the coding and decoding operability.

To reduce the data rates even further, one or more coded bits may be removed from the symbol. FIGS. 6*e*-6*h* illustrate constellations that correspond to 3 coded bits (8DSQ), 2 coded bits (4SQ), and 1 coded bit (2DSQ), respectively. One of the advantages in reducing the number of coded bits is that for each coded bit reduction, a certain number of the LDPC check bits may be considered as "known." As a result, bandwidth previously allocated to a full set of LDPC check bits may be freed to improve the data rate by, for example, providing more payload capacity. Moreover, as more fully described below, transmitting 4SQ symbols, either continuously or periodically, provides advantages at the receive end by enabling the receiver circuitry to calculate log-liklihood-ratios (LLRs) directly from the "X" and "Y"-axis PAM data.

FIG. 7 illustrates a default 10GBASE-T frame structure 702 including respective groups of uncoded and coded bits 704 and 706. To maintain the frame structure for modes of operation that employ fewer uncoded bits, such as the symbol frame 708, the bit location for a "discarded" uncoded bit remains in the frame, but is defined as a "zero", at 710. Additionally, an integral number of Ethernet frames are "stuffed" or inserted into the 10GBASE-T transport frame. FIGS. 8*a*-8*c* illustrate Ethernet transport frames having reduced Ethernet data blocks, and stuff bit blocks based on the number of uncoded bits included in the symbol frame. The table shown below shows the number of stuff bits provided for modes of operation that employ from 4 to 7 information bits per symbol. The "stuff bit" locations within the frame may also be used

| Bit rates of impaired cable modes | | | | |
|---|---|---|---|---|
| Bits per Symbol | Effective Bit Rate (Gb/s) | Number of 65B Frames | Number of Stuff Bits | User Bit Rate (Gb/s) |
| 7 | 11.2 | 50 | 0 | 10.000 |
| 6 | 9.6 | 42 | 8 | 8.400 |
| 5 | 8.0 | 34 | 16 | 6.800 |
| 4 | 6.4 | 26 | 24 | 5.200 | for other signaling purposes such as in-band communication, updating THP coefficients during normal link operation, and so forth.

Receiver Processing

In order to keep the analog front-end of the 10GBASE-T transceivers relatively unchanged, the average power of the impaired mode constellations is kept roughly equal to the default 128-DSQ constellation. In order to do this, at the receiver, the different constellation mappings are translated appropriately in accordance with method steps more fully described below.

FIG. 9a illustrates a flowchart with steps for a method of receiving 10GBASE-T data symbols. The method involves receiving transmitted symbols, at step 902. The symbol mode is then determined and/or confirmed, at step 904 to identify whether the symbols are 128-DSQ, 64-SQ, 32-DSQ, 16-SQ, 8-DSQ, 4-SQ, or 2-DSQ. At step 906, the symbols are translated to undo the precoding effects of the THP precoder at the transmitter. The symbol constellations are then remapped, at step 908, in a manner that generates an output that is common among all of the possible constellation modes. This enables a universal bit slicing algorithm to decode all of the possible constellation modes, at step 910.

Figure 3:
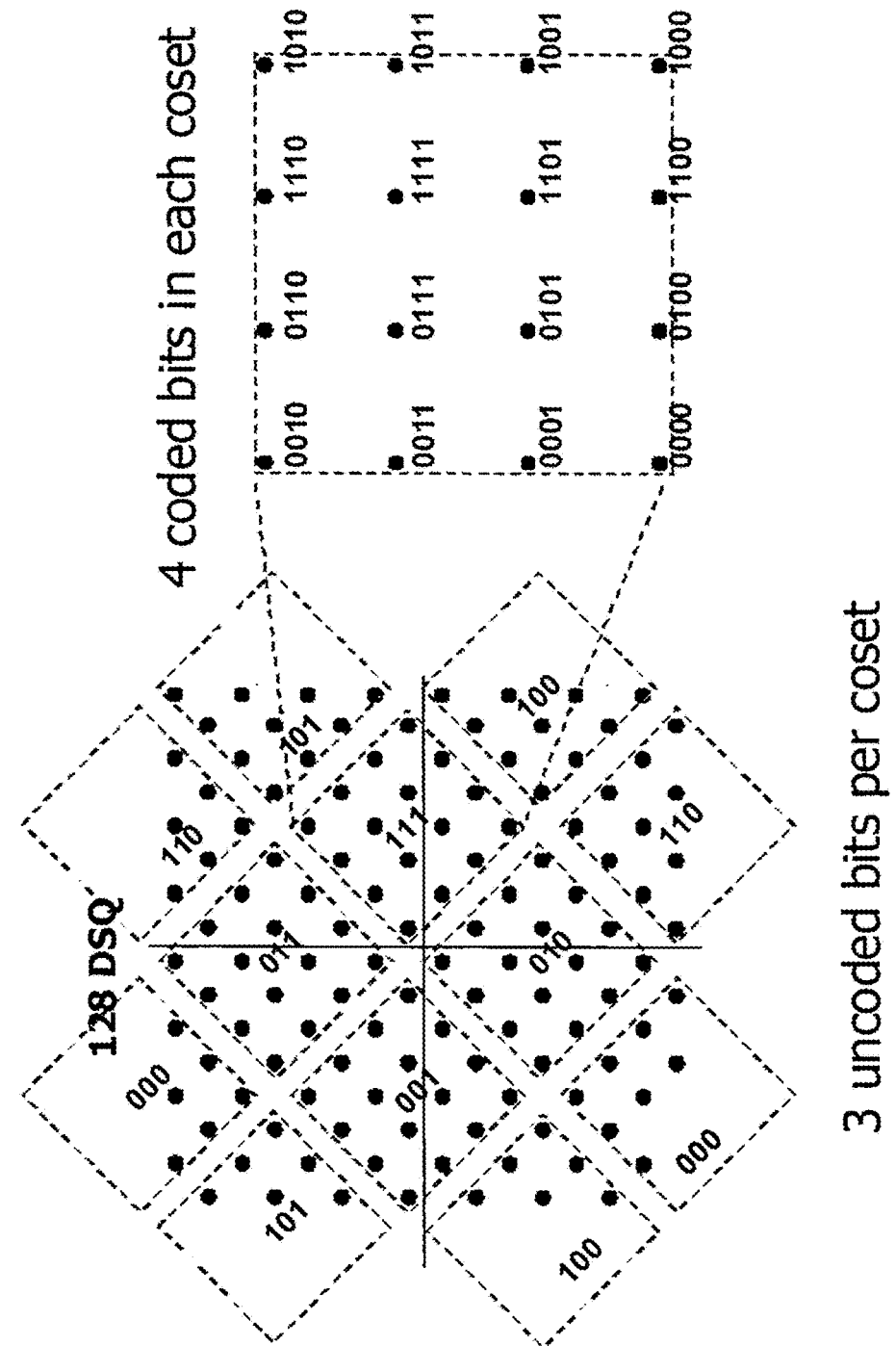
FIG. 3 illustrates a constellation for 128-DSQ modulation used in the standard of FIG. 2 and the labeling of points in a coset used with the constellation.

FIG. 9b illustrates further detailed steps for one specific embodiment of a method corresponding to the remapping and bit slicing steps of FIG. 9a. At step 912, each point in the translated (precoding) constellation is remapped, to include an additional (2,2) value in two-dimensional constellation space. A coset offset value is then subtracted to generate an intermediate value for each point, at step 914. The offset values depend on the constellation mode. The intermediate value is then divided by 4, at step 916. An integer truncating operation is then carried out, at step 918, in both the X and Y dimensions of the constellation space. The correct coset (decoding of the uncoded bits) may then be identified through use of a lookup table, at step 920. The bit slicing method involves offsetting the rotated, scaled constellation of FIG. 3 by (12, 12), to generate a mapped point so that for all possible received PAM-16 pairs, the results are positive. At this point, the two least-significant-bits (LSBs) of the mapped point can be used to determine the LLRs of the coded bits for input to the LDPC decoder.

Determining the LLRs for decoding the coded bits during the bit slicing method is generally carried out through an analysis of decision thresholds at Magnitude modulo 4. Once the coded points have been decoded by the LDPC decoder, the information needed to slice the uncoded bits is then available. The received point is mapped so that rounding via integer truncation will determine the correct coset. This involves mapping the line half-way between the decoded coset points so that it lies on an integer boundary. Generally, the 4-bit label assigned to each of the coset points maps to an integer location within the coset as:

$$(x,y) = (\{c0, c0 \oplus c1\}, \{c2, c2 \oplus c3\})$$

The 4-bit label above may be used in the following translation equation that translates a given received, mapped point so that the slicer boundaries are appropriately aligned:

"Slicer Input=Received, Mapped Point+(2,2)−
  ($\{c0, c0 \oplus c1\}, \{c2, c2 \oplus c3\}$)

The slicer mapping consistent with the equation above may be used to establish slicing rules for the 128-DSQ symbols. Similar slicing rules may also be established in the same way for the other constellation modes.

As noted above, however, for data transmission of 4-SQ symbols, the LLRs for decoding the coded bits (2) can be directly calculated from the X and Y-axis PAM data. In one embodiment, transmissions at 4-SQ enable continuous training along the link during normal link operations. This enables real-time THP coefficient updates during normal operation without having to bring the link offline to carry out an initialization procedure.

Figure 10:
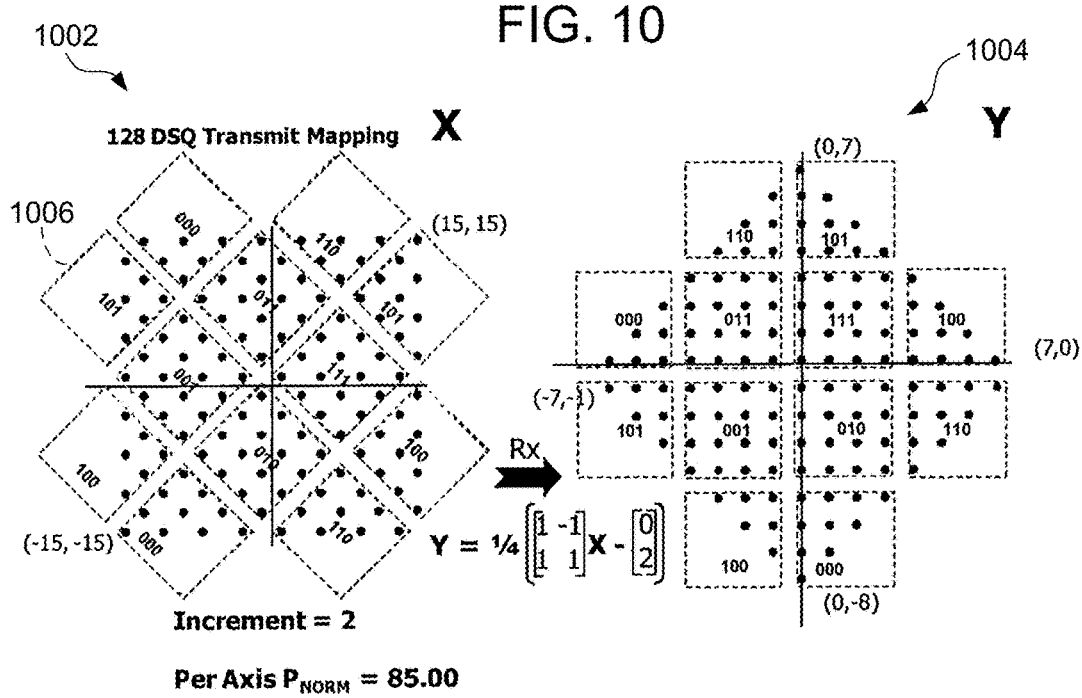
FIG. 10 illustrates an example of a 128DSQ transformation that can be performed at the receiver prior to the coded bit slicing described herein.

Consistent with the initial translation step 906 in FIG. 9a noted above, the post-precoder scalings, or mappings carried out at the receiver are shown in FIGS. 10 through 14. FIG. 10 illustrates an exemplary translation of constellation points for a 128 DSQ symbol from a transmit mapping, at 1002, to a receiver mapping, at 1004. The transmit mapping is shown as a group of points formed within a square-shaped area, with the sides of the square parallel to the respective X and Y axes. The upper right-most point has the coordinates (15, 15), while the lower left-most point is assigned coordinates (−15, −15). Twelve cosets 1006 are shown, although the peripheral eight of the twelve are partial cosets formed as a result of the Tomlinson-Harashima precoding at the transmit side of the channel. The precoding modularly extends the constellation out to two or three times the original boundaries.

The first step in the translation involves generally rotating the constellation by 45 degrees, such that the point originally residing at (15, 15) is zeroed along the x-axis, with a Y offset. The coordinate values are then scaled by a scaling factor. The result is a collection of points mapped in a diamond-shape, with the relationship to the transmit mapping being:

$$Y = \frac{1}{4}\left(\begin{bmatrix} 1 & -1 \\ 1 & 1 \end{bmatrix} X - \begin{bmatrix} 0 \\ 2 \end{bmatrix}\right)$$

Figure 11:
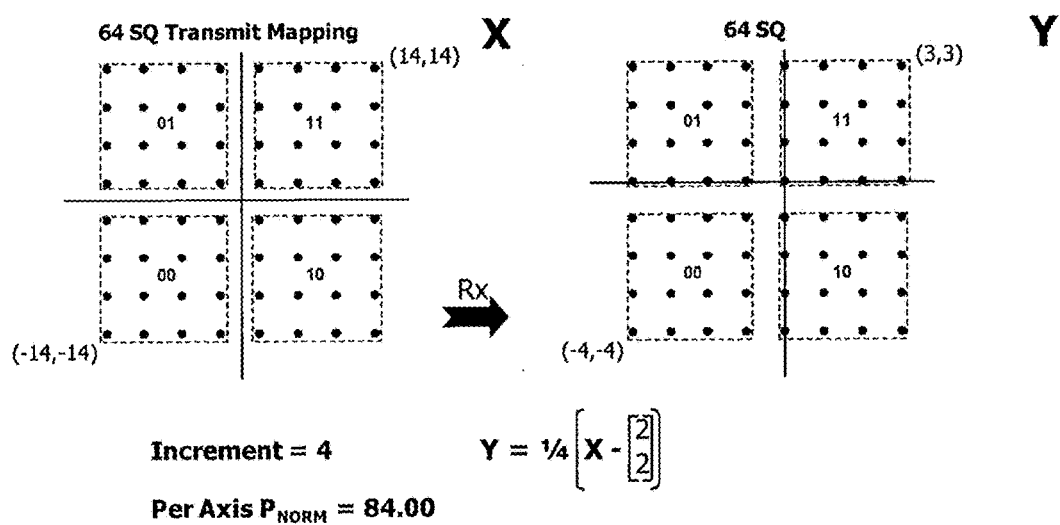
FIG. 11 illustrates an example of a 64 SQ transformation that can be performed at the receiver prior to the coded bit slicing described herein.

FIG. 11 illustrates a transmitter-to-receiver mapping for a 64-SQ constellation, corresponding to a data frame with 2 uncoded bits. Since only 2 uncoded bits are employed by the constellation, the bits define four cosets or regions (00, 01, 10, 11), rather than eight (as provided by a 128 DSQ constellation). Similar to the 128 DSQ constellation, the 64 SQ transmit symbol is rotated and scaled in accordance with the relationship:

$$Y = \frac{1}{4}\left(X - \begin{bmatrix} 2 \\ 2 \end{bmatrix}\right)$$

Figure 12:
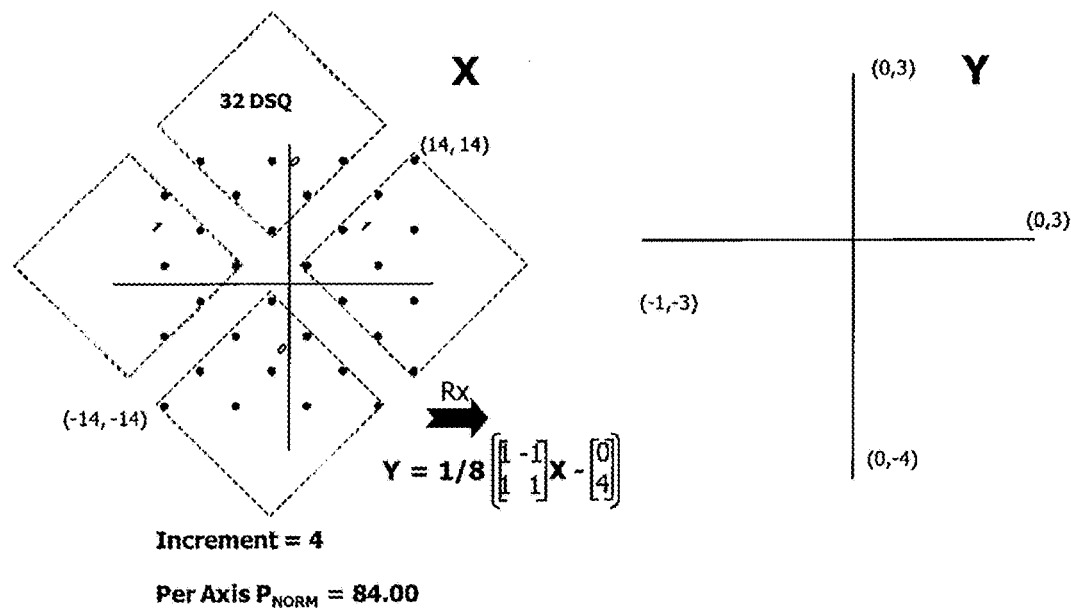
FIG. 12 illustrates an example of a 32 DSQ transformation that can be performed at the receiver prior to the coded bit slicing described herein.
Figure 13:
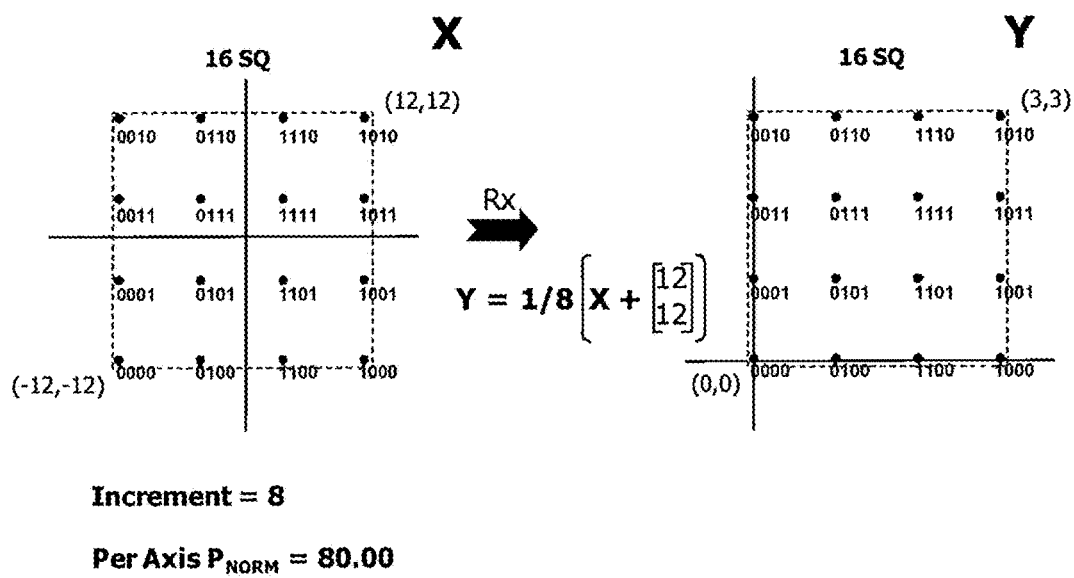
FIG. 13 illustrates an example of a 16 SQ transformation that can be performed at the receiver prior to the coded bit slicing described herein.

FIGS. 12 and 13 illustrate respective constellation mappings from the transmit to the receiver side for constellations involving one and zero uncoded bits, respectively. The respective mapping relationships are expressed as:

$$Y = \frac{1}{8}\left(\begin{bmatrix} 1 & -1 \\ 1 & 1 \end{bmatrix} X - \begin{bmatrix} 0 \\ 4 \end{bmatrix}\right)$$

and $$Y = \frac{1}{8}\left(X + \begin{bmatrix} 12 \\ 12 \end{bmatrix}\right)$$

Figure 14:
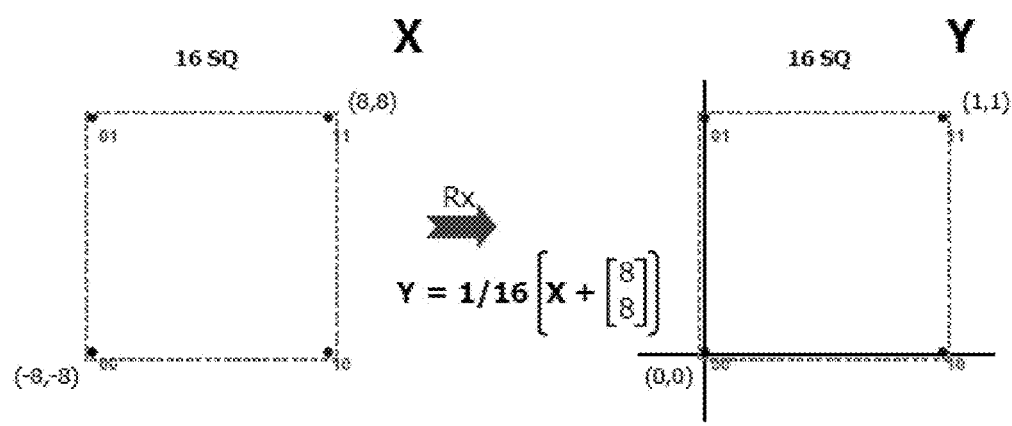
FIG. 14 illustrates an example of an 8 SQ transformation that provides for direct calculation of LLRs.

FIG. 14 illustrates a constellation mapping for a 4 SQ symbol. As noted above, this transmission mode allows the receiver to directly calculate the LLR's from the X and Y-axis PAM data. The specific mapping relationship is expressed as:

$$Y = \frac{1}{16}\left(X + \begin{bmatrix} 8 \\ 8 \end{bmatrix}\right)$$

With the constellation having undergone an initial translation at the receiver side to undo the effects of the THP precoding, a further translation is performed to set the points up so that a bit slicer can straightforwardly decode the coded and uncoded bits in the constellation, the same way for different types of constellations. In other words, for different constellations, the different mappings result in a common or standard code region for the bit slicer. This allows a common bit slicer to decode the bits using a common decoding algorithm.

Figure 15:
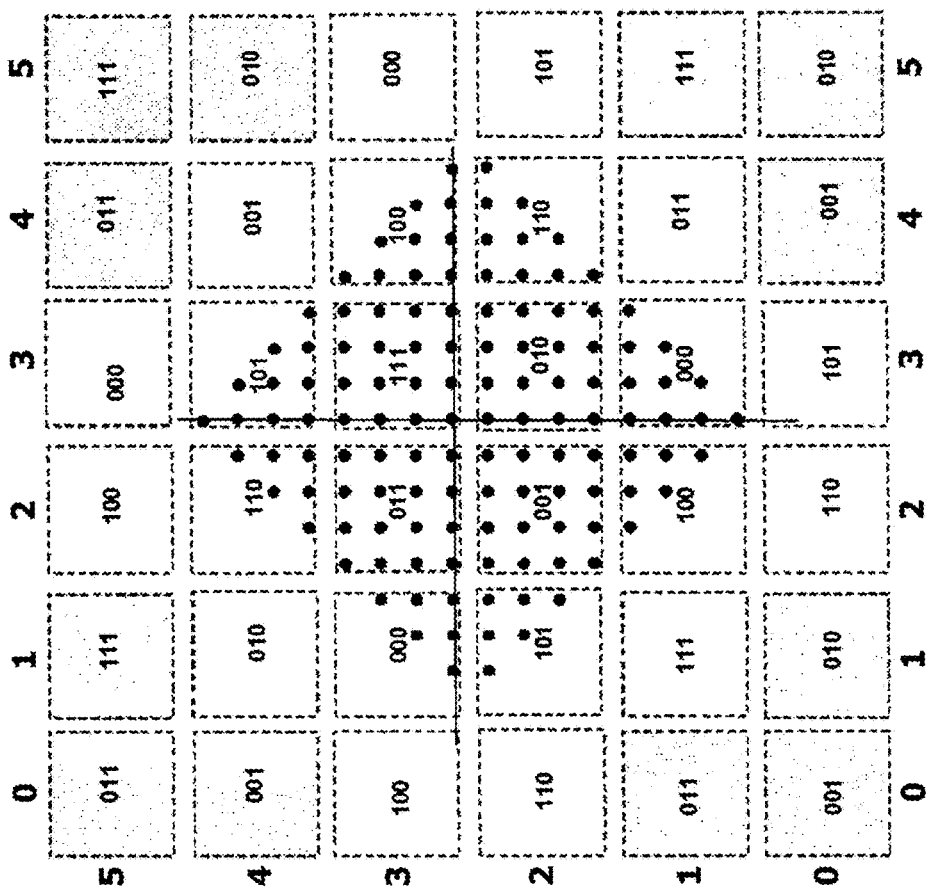
FIG. 15 illustrates an example of a further remapping of a 128 DSQ constellation for the uncoded bit slicing of FIG. 9b.

FIG. 15 illustrates an extended mapping that generally involves altering the receive mappings for each of the constellations so that the results are positive for all possible input values. This altered mapping was described above with respect to the method steps illustrated in FIGS. 9a and 9b. The altered mapping allows for the proper coset identification via the lookup table shown in the figure. FIGS. 16 and 17 illustrate respective extended mappings corresponding to the 32-DSQ and 16-SQ constellation modes, respectively.

Figure 18:
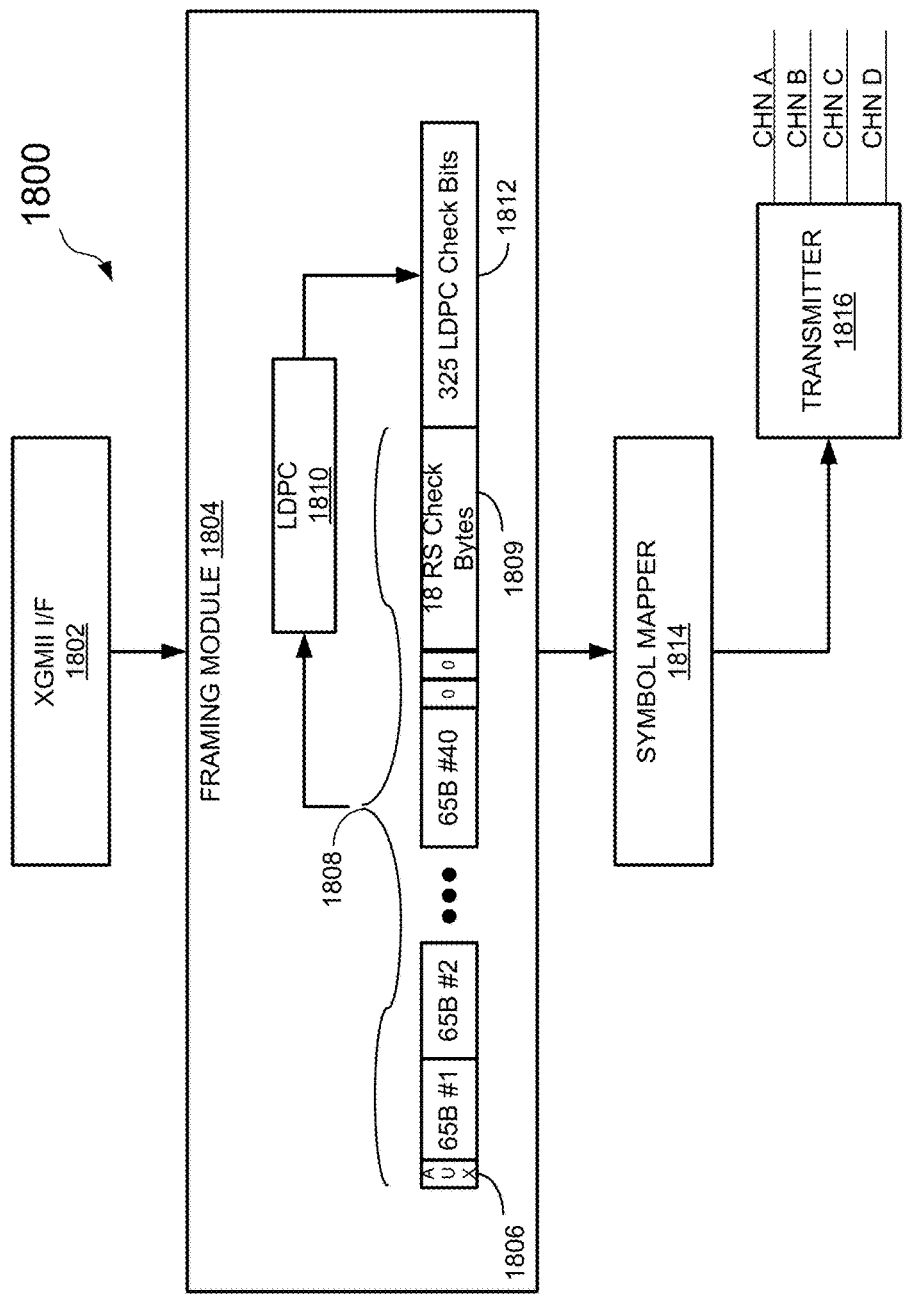
FIG. 18 illustrates a block diagram of a BASE-T transceiver that employs a framing module to carry out Ethernet data bit allocations and LDPC framing similar to previously described embodiments herein.

FIG. 18 illustrates one embodiment of a BASE-T transceiver, generally designated 1800, that employs a framing module to generate a unique transport frame for variable rate Ethernet data transmission. The transport frame allows for resulting data rates that may be precise sub-multiples of a full 10 Gbps data rate. For example, data received via Ethernet data blocks from the XGMII interface at a symbol rate of 10 GSym/sec may be rate shifted for transmission across an Ethernet link at rates of, for example, exactly 5.0 Gbps or 2.5 Gbps through use of the transport framing apparatus and methodology described more fully below.

Further referring to FIG. 18, the transceiver 1800 includes a 10 Gigabit Media Independent Interface (XGMII) 1802 that interfaces the transceiver (PHY) to a media access controller (MAC). From a transmit perspective, the interface receives data at a rate of 10 Giga-Symbols per second (10 GSym/s). The XGMII interface then feeds the data to a framing module 1804. The framing module aggregates a certain amount of the data as a payload, for example, forty 65B frames (each with 8 bytes of data), at 1808, together with an auxiliary bit 1806, two "zero bits" and a number of Reed-Solomon check bytes, at 1809. For one specific embodiment, the Reed-Solomon check bytes are in accordance with a Reed-Solomon code such as R5256 (128, 110), which includes eighteen (18) check bytes that are capable of correcting, for example, 9 data payload bytes in the frame.

The aggregated information is then forward error encoded via an LDPC encoder 1810, which appends the aggregated information with a series of 325 LDPC check bits, at 1812. The resulting generated data structure takes the form of an LDPC transport frame.

With continued reference to FIG. 18, each transport frame generated by the framing module 1804 is mapped into plural symbols by a symbol mapper 1814. For one specific embodiment, the symbols are in the form of back-to-back PAM-8 symbols, each symbol having a total of 6 bits (4 coded via LDPC, 2 uncoded), creating a 64SQ constellation. The uncoded bits that are associated with the 64SQ constellation are nevertheless protected by the Reed-Solomon check bytes provided in the transport frame.

The symbols are then transmitted at a symbol rate of, for example, 500 Mega-symbols per second by a transmitter 1816 across plural physical channels CHN A, CHN B, CHN C and CHN D. The transmit symbol rate for one embodiment may be matched to the expected rated bandwidth (half the symbol rate) of the physical channels provided by the cable. Other data rates may be utilized by varying the symbol rate and/or the symbol mapping scheme. For example, by reducing the symbol rate to 250 MS/s (corresponding to a cable bandwidth of 125 MHz), a data rate of 2.5 Gbps may be realized. With the parameters specified above, the resulting data rate is 5.0 Gb/s, with an improved signal-to-noise ratio (SNR) due to the back-to-back PAM-8 signaling scheme. The scheme provides a way to enable 5.0 Gb/s data rates over lower quality cables, such as CAT-6, for distances on the order of 100 meters.

Figure 19:
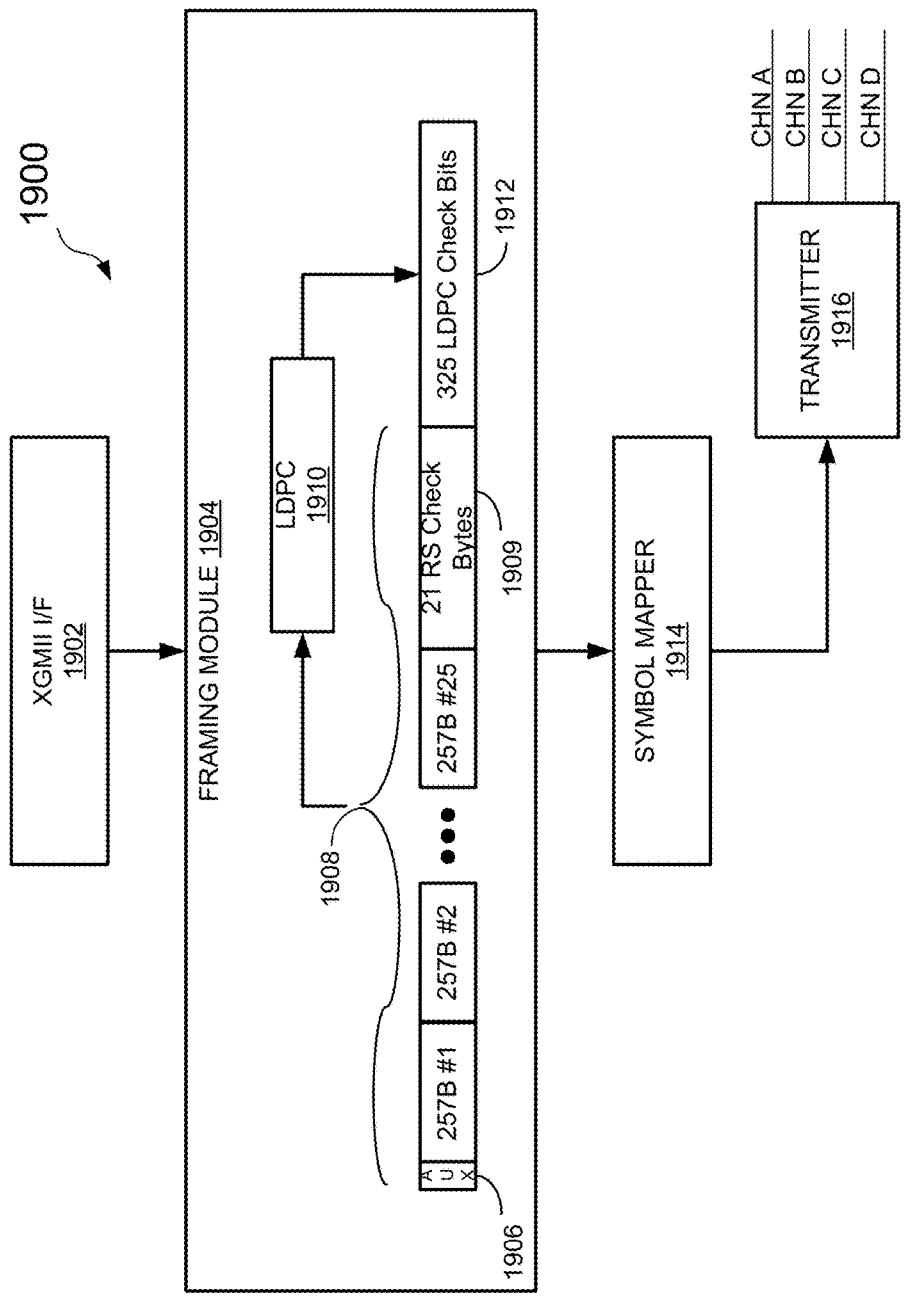
FIG. 19 illustrates a block diagram of a BASE-T transceiver that employs a further embodiment of a framing module to carry out Ethernet data bit allocations and LDPC framing similar to previously described embodiments herein.

FIG. 19 illustrates a further embodiment of a BASE-T transceiver, generally designated 1900, that employs a framing module similar to that shown in FIG. 18 to generate a unique transport frame for variable rate Ethernet data transmission. The embodiment of FIG. 19 provides a way to achieve a 5.0 Gb/s data rate in a similar manner as the embodiment of FIG. 18, but without the need to employ "zero bits" into the frame.

Further referring to FIG. 19, the transceiver 1900 includes a 10 Gigabit Media Independent Interface (XGMII) 1902 that interfaces the transceiver (PHY) to a media access controller (MAC). From a transmit perspective, the interface receives data at a rate of 10 Giga-Symbols per second (10GSym/s). The XGMII interface then feeds the data to a framing module 1904. The framing module aggregates a certain amount of the data as a payload, for example, ten 257B frames (each with 8 bytes of data), at 1908, together with an auxiliary bit 1906, and a number of Reed-Solomon check bytes, at 1909. For one specific embodiment, the Reed-Solomon check bytes are in accordance with a Reed-Solomon code such as R5256 (128, 107), which includes twenty-one (21) check bytes.

The aggregated information is then forward error encoded via an LDPC encoder 1910, which appends the aggregated information with a series of 325 LDPC check bits, at 1912. The resulting generated data structure takes the form of an LDPC transport frame.

Rate Pacing

It should be noted that the receive process described above may be applied in a manner that cooperates with a rate pacing scheme to manage the data rates between media access controllers (MACs) and corresponding physical layer (PHY) transceiver circuits. In one embodiment, a port-based PAUSE signaling scheme using buffers and internal MACs is employed. This allows a seamless integration with legacy equipment.

A further rate pacing embodiment involves use of a programmable ordered set to generate control signals that indicate XON and XOFF. Signaling on the SERDES interface for ordered sets can occur in Idle or prior to a Start of Frame marker. No additional bandwidth is consumed for PAUSE insertion.

An additional rate pacing embodiment employs an intra-packet idle frame that includes a group of eight bytes which are used solely for rate adaptation. The scheme involves a fixed counting method so that for every 8N bytes transmitted, a 65B Intra-Packet Idle (IPI) frame would be sent. One way to implement the process is to employ a counter that either adds a programmable increment A or subtracts a programmable decement B. If the value of the counter is greater than or equal to zero, the counter is decremented. Otherwise the counter is incremented. The net result is that the ratio of increments to decrements exactly matches the desired average. For example, for a desired 1.1 Gb/s interface across a SERDES interface, A may be set to 11 and B set to 89, and every time B is selected, data is allowed to flow. This gives exactly 1.1 Gb/s on a 10 Gb/s interface, optimally spread out. This scheme minimizes buffering and eliminates the requirement for MACs in the PHY.

Those having skill in the art will appreciate the many benefits and advantages afforded by the embodiments presented herein. Of significant benefit is the ability to reduce 10GBASE-T data rates without altering the transport frame structure. Further, by incorporating certain receive mappings corresponding to a given transmission mode, a common decoding and bit slicing scheme may be implemented at the receiver end of the channel. Additionally, by utilizing the info-field exchange mechanism in 10GBASE-T, sub-rate training sequences may be carried out quickly to arrive at a suitable sub-rate for data transmission without having to restart the 10GBASE-T autonegotiation process. This significantly reduces the time expended in determining a suitable sub-rate data rate.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented.

With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., ") is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A BASE-T Ethernet transceiver comprising:
a BASE-T Ethernet transmit circuit including
a BASE-T Ethernet data framing module including
an input interface to receive Ethernet block data bits at a first data rate,
logic to associate the Ethernet block data bits with an auxiliary bit and a number of Reed-Solomon check bytes, and
a forward error correction encoder coupled to the logic to encode all of the data bits, auxiliary bit and the Reed-Solomon check bytes into a first error encoded transport frame having plural error check bits;
a symbol mapper to receive the first error encoded transport frame and to modulate the first error encoded transport frame into symbols, each of the symbols having uncoded bits;
a BASE-T transmitter coupled to the symbol mapper to transmit the symbols over an Ethernet link at one of a selection of symbol rates; and
wherein errors in the uncoded bits are correctable via the Reed-Solomon check bytes.

2. The BASE-T Ethernet transceiver of claim 1, wherein the Reed-Solomon check bytes are in accordance with an R5256 (128, 110) error code.

3. The BASE-T Ethernet transceiver of claim 2, wherein the logic associates the Ethernet block data bits with the auxiliary bit, the Reed-Solomon check bytes, and two zero bits.

4. The BASE-T Ethernet transceiver of claim 1, wherein the Reed-Solomon check bytes are in accordance with an R5256 (128, 107) error code.

5. The BASE-T Ethernet transceiver of claim 1, wherein at a symbol rate of 500 MSym/s, the transmitter transmits data at a rate of 5 Gbps.

6. The BASE-T Ethernet transceiver of claim 1, wherein at a symbol rate of 250 MSym/s, the transmitter transmits data at a rate of 2.5 Gbps.

7. The BASE-T Ethernet transceiver of claim 1, wherein the symbol mapper includes a PAM-8 encoder.

8. The BASE-T Ethernet transceiver of claim 7, wherein the symbol mapper transforms the transport frame into back-to-back PAM-8 modulated symbols.

9. The BASE-T Ethernet transceiver of claim 7, wherein the symbol mapper generates 512 symbols for the transport frame.

10. A BASE-T Ethernet data framing module comprising:
an input interface to receive Ethernet block data bits at a data rate of 10 GSym/s; logic to associate the Ethernet block data bits with an auxiliary bit and Reed-Solomon check bytes; and
an LDPC encoder coupled to the logic to encode all of the Ethernet block data bits, the auxiliary bit and the Reed-Solomon check bytes into an error encoded transport frame having 325 error check bits.

11. A method of transferring Ethernet data, the method comprising:
framing BASE-T Ethernet data including
receiving Ethernet block data bits at a first data rate,
associating the Ethernet block data bits with an auxiliary bit and Reed-Solomon check bytes, and
error encoding all of the data bits, auxiliary bit and Reed-Solomon check bytes into a first forward error encoded transport frame having plural error check bits;
mapping the error encoded transport frame into symbols, each of the symbols having uncoded bits;
transmitting the symbols as first Ethernet data over a BASE-T Ethernet link at one of a selection of symbol rates; and
correcting errors in the uncoded bits via the Reed-Solomon check bytes.

12. The method of claim 11, wherein the Reed-Solomon check bytes are in accordance with an R5256 (128, 110) error code.

13. The method of claim 12, wherein the associating includes associating the Ethernet block data bits with the auxiliary bit, the Reed-Solomon check bytes, and two zero bits.

14. The method of claim 11, wherein the Reed-Solomon check bytes are in accordance with an R5256 (128, 107) error code.

15. The method of claim 11, wherein at a selected symbol rate of 500 MSym/s, the transmitted data rate comprises 5.0 Gbps.

16. The method of claim 11, wherein at a selected symbol rate of 250 MSym/s, the transmitted data rate comprises 2.5 Gbps.

17. The method of claim 11, wherein the mapping comprises encoding the data transport frame into plural PAM-8 symbols.

18. The method of claim 17, wherein the plural PAM-8 symbols comprises plural back-to-back PAM-8 symbols.

19. The method of claim 18, wherein the plural PAM-8 symbols comprises 512 symbols.

\* \* \* \* \*